(12) United States Patent
Maeda et al.

(10) Patent No.: US 6,376,889 B1
(45) Date of Patent: Apr. 23, 2002

(54) DIELECTRIC THIN FILM ELEMENT AND PROCESS FOR MANUFACTURING THE SAME

(75) Inventors: Chisako Maeda; Akira Yamada; Toshio Umemura; Fusaoki Uchikawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/423,522

(22) PCT Filed: May 12, 1998

(86) PCT No.: PCT/JP98/02086

§ 371 Date: Nov. 10, 1999

§ 102(e) Date: Nov. 10, 1999

(87) PCT Pub. No.: WO98/52235

PCT Pub. Date: Nov. 19, 1998

(30) Foreign Application Priority Data

May 13, 1997 (JP) .................................. PCT/JP97/01601
Nov. 19, 1998 (WO) .................................. WO98/52235

(51) Int. Cl.⁷ .............................................. H01L 29/84
(52) U.S. Cl. ...................................... 257/419; 257/417
(58) Field of Search ................ 257/632, 635, 257/640, 649, 417–719

(56) References Cited

U.S. PATENT DOCUMENTS 3,773,564 A * 11/1973 Yamaka et al. ............. 136/213
4,531,267 A * 7/1985 Royer ........................ 257/419
5,216,490 A * 6/1993 Greiff et al. ............... 73/517 R
5,268,315 A * 12/1993 Prasad et al. ................ 438/314
5,412,160 A * 5/1995 Yasumoto et al. ........... 174/258
5,506,177 A * 4/1996 Kishimoto et al. .......... 438/624
5,774,961 A * 7/1998 Takeuchi et al. ............ 29/25.35
5,801,069 A * 9/1998 Harada et al. ................ 438/52
5,841,584 A * 11/1998 Takatani et al. ............. 359/586

FOREIGN PATENT DOCUMENTS

| JP | 60-126839 | 7/1985 |
| JP | 2-280114 | 11/1990 |
| JP | 3-219506 | 9/1991 |
| JP | 6-350154 | 12/1994 |
| JP | 7-274288 | 10/1995 |

\* cited by examiner

*Primary Examiner*—Allan R. Wilson
(74) *Attorney, Agent, or Firm*—Sughrue Mion, PLLC

(57) ABSTRACT

A process for manufacturing a plurality of dielectric thin film devices by forming a lower layer on a substrate, coating a dielectric thin film on the lower layer, forming the dielectric thin film into a plurality of predetermined shapes, and, if desired, forming an upper structure on each of the plurality of dielectric thin films, wherein the dielectric thin film is divisionally formed on the lower layer by using a mask after the lower layer is formed to have a stress in a direction opposite to that of the dielectric thin film, or alternatively the dielectric thin film is divided into predetermined shapes after being formed.

19 Claims, 7 Drawing Sheets

DIELECTRIC THIN FILM ELEMENT AND PROCESS FOR MANUFACTURING THE SAME

FIELD OF THE INVENTION

The present invention relates to an electric device or element with dielectric film and a method for manufacturing the device.

BACKGROUND OF THE INVENTION

Conventionally, a bulk material, such as ceramic and single crystal material, has been used for dielectric devices; however, it is being replaced by a dielectric film for thin devices. The dielectric thin film device employs a specific structure in which a substrate supports a lower layer, a dielectric film on the lower layer and, if desired, an upper structure on the dielectric layer.

The dielectric thin film device so constructed is manufactured through various processes. Specifically, a plate made of semiconductor single-crystal is provided on its entire upper surface with the lower layer. Then, the lower layer is coated on its upper surface with the dielectric film. Further, another film for the upper structures is formed on the dielectric film, which is then patterned through a physical or chemical treatment to form the upper structures. Afterwards, the dielectric film and then the lower layer are patterned through a chemical process. The layered and patterned plate is finally separated into pieces, i.e., dielectric devices.

Another process for manufacturing the dielectric devices is disclosed in JP(A) 6-350154 in which the plate is formed on its one surface with a plurality of layers including an insulating layer, a lower electrode film, a piezoelectric film, and an upper electrode film. The plate is then etched and removed from its opposite surface to form a so-called floating structure.

The process, however, has several drawbacks. For example, the plate is different from the dielectric film in a distance of crystal lattice, a coefficient of thermal expansion, and other material features, which tends to induce a considerably high stress in the dielectric film after its formation. Also, a high temperature at the formation of the dielectric layer results in a phase transition in the dielectric layer due to a restriction force applied by the plate at cooling, which increases the internal stress in the dielectric layer.

The increased stress will lead an undesired transformation in the plate, which prevents the upper structures from being made with a great precision. The transformation also prevents the plate from being precisely fixed on an automated transporting device before its patterning. Also, forcing the plate in place will result in its undesirable damage. Besides, the transformation may change dielectric, piezoelectric, pyroelectric, and ferroelectric features of the dielectric film.

SUMMARY OF THE INVENTION

Accordingly, a primary object of the present invention is to provide a dielectric thin film device, which includes a minimal stress in a dielectric film and a reduced transformation of a substrate, providing suitable features for the dielectric film and ensuring a precise formation of upper structures.

Thus, according to the present invention, it is found that, in manufacturing a plurality of dielectric thin film devices by forming a lower layer on a substrate, coating a dielectric thin film on said lower layer, forming said dielectric thin film into a plurality of predetermined shapes, and, if desired, forming an upper structure on each of the plurality of dielectric thin films, said lower layer is formed to have a stress in a direction opposite to that of said dielectric thin film, as a result of which the stress of each component reduces.

The stress generated in the substrate is calculated by measuring its deflection and from the following equation (1):

$$\sigma = (d/(D/2)^2) \times (E/3(1-\nu)) \times (Ts^2/Tf) \quad (1)$$

where $\sigma$ is a stress in the substrate, E a Young's modulus, Ts a thickness, $\nu$ a Poisson's ratio, D a diameter, and d a deflection of the substrate.

According to the equation (1), the substrate has a deflection of 10 $\mu$m or less when it has a stress of $1 \times 10^8$ Pa or less, which allows the upper structure to be formed with accuracy and the dielectric thin film device to be produced without being damaged in the automated transporting device.

Also, it is to be understood that, by forming a stress adjusting layer, used as protection layer for the dielectric thin film device, except said lower layer, by dividing the dielectric thin film before the formation of the upper structure, by adding an additive to the dielectric thin film, or forming a bridge structure as upper structure, the dielectric thin film can have a smaller stress.

In addition, the stress in the dielectric thin film is calculated from a peak shift of the Raman microspectroscopy, and it turns out that a stress of $1 \times 10^8$ Pa or less does not affect the characteristics of the dielectric thin film.

Therefore, the present invention is to provide a dielectric thin film device, in which a substrate or a lower layer formed on the substrate is coated with a dielectric thin film and then, if desired, an upper structure, characterized in that each component constituting the thin film device has a stress of $1 \times 10^8$ Pa or less. Alternatively, the thin film may be coated for example by PVD.

One of typical structures and methods for relaxing the stress is 1) to design the lower layer to have a stress in a direction opposite to that of the dielectric thin film. However, as an alternative of or together with the above-mentioned method, following structures and methods 2)–5) may be used.

Also, as a means of making the lower layer have a stress in a direction opposite to that of the dielectric thin film, a structure growing mechanism may be used for adjusting the stress of the lower layer for example based upon a condition under which the coating is formed.

Although, in general, a dielectric thin film often has a compressive stress, silicon nitride formed by CVD and tantalum oxide by PVD have a tensile stress.

2) A stress-adjusting layer is formed except the main components of the dielectric thin film device, the layer having a stress in a direction to relax the stress of the components.

As an example of the stress-adjusting layer, there is a thin film of such as silicon nitride or tantalum oxide.

3) At least one of La, Ca or Sr is added to the dielectric thin film. When the dielectric thin film is composed mainly of lead titanate, the addition of one of La, Ca or Sr to the dielectric thin film can relax the stress thereof. More specifically, there are a dielectric thin film that is composed mainly of lead titanate and contains 0.01–8 weight percent of lanthanum oxide, a dielectric thin film that is composed mainly of lead titanate and contains 0.01–42 weight percent of calcium titanate, and the dielectric thin film that is composed mainly of lead titanate and contains 0.01–39 weight percent of strontium titanate.

4) A mask is used on a substrate or a lower layer for divisionally forming the dielectric thin film into predetermined shapes.

5) The dielectric thin film is formed on a substrate or a lower layer, and then is divided into predetermined shapes.

A mixed solution with acid that contains a small amount of HF is used for etching the dielectric thin film, which allows a thin film device of high quality to be obtained, limiting the preferred etching of grain boundary. More specifically, the dielectric thin film is formed, and then is etched by a strong acid solution preferably with 1 volume percent or less of hydrofluoric acid into predetermined separated shapes.

Thus, the dielectric thin film operates properly without possible difficulty caused by the stress. The substrate has a deflection of 10 μm or less, which allows an accurate formation of the micro upper structure. The substrate is not damaged even if fixed in the automated transporting device, which allows a yield thereof to be improved. Also, since a stress generated in the substrate is relatively small, a reliability of the upper structure is improved.

DETAILED DESCRIPTION OF THE PREFERRED EMBODIMENTS

Hereinafter, the present invention is described in detail with reference to the embodiments.

EXAMPLE 1

Figure 1:
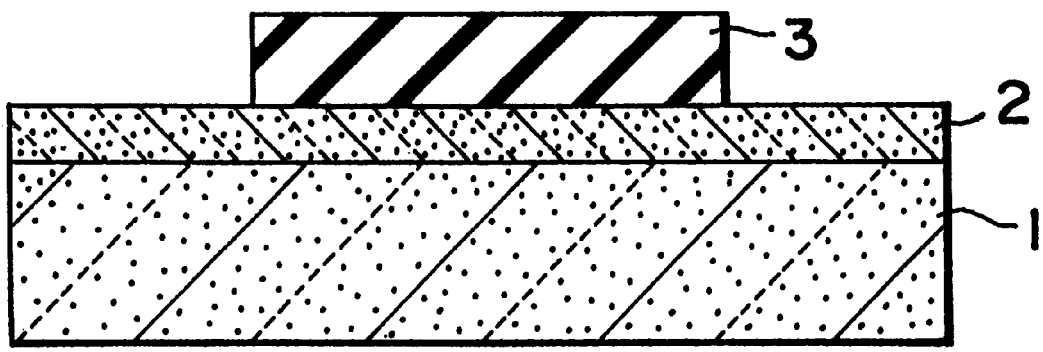
FIG. 1 is a sectional view of a dielectric thin film device of a first example according to the present invention.

FIG. 1 shows a sectional view of a dielectric thin film device of a first embodiment or example according to the present invention. In this example, provided was a substrate 1 in the form of circular plate having a diameter of 3 inches and made of gallium arsenide. A lower layer 2 having a thickness of 100 nanometers and made of nitride silicone was coated on an upper surface of the substrate 1 by a plasma chemical-vapor-deposition (CVD) method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 50 nm per minute.

Then, the lower layer 2 was coated with a dielectric film 3 having a thickness of 1 μm by a RF magnetron sputtering method. In this sputtering, used were a target of lead titanate and a mixed gas of argon and oxygen in the ratio of 9:1. A temperature of the substrate was kept at 600 °C. A deposition rate was 50 nm per minute.

Afterwards, a photo-resist was coated on the dielectric film 3, which was then etched by a conventional wet-etching process to divide the dielectric film into pieces each having a volume of $3 \times 10^{-5}$ mm$^3$. The resultant substrate was measured and, as a result, it had a deformation of 8 μm.

EXAMPLE 2

In a second example of the present invention, provided was a substrate 1 in the form of circular plate having a diameter of 3 inches and made of gallium arsenide. A lower layer 2 having a thickness of 100 nm and made of nitride silicone was coated on an upper surface of the substrate 1 by a plasma CVD method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 10 nm per minute.

Figure 2:
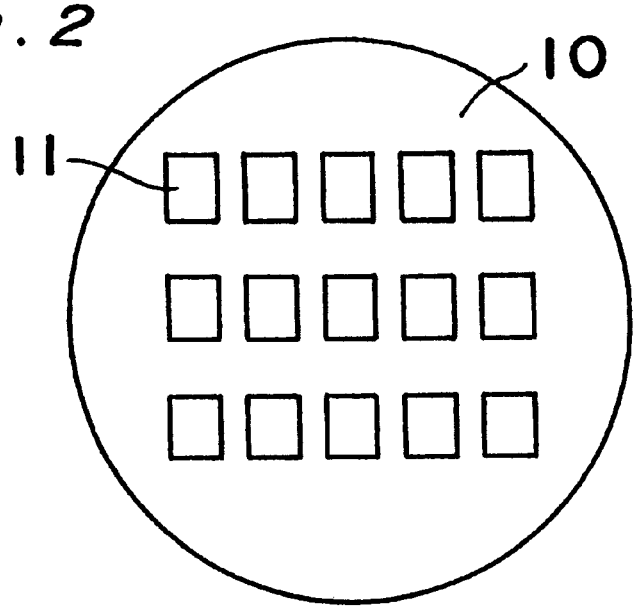
FIG. 2 shows a mask used in a third example.
Figure 3:
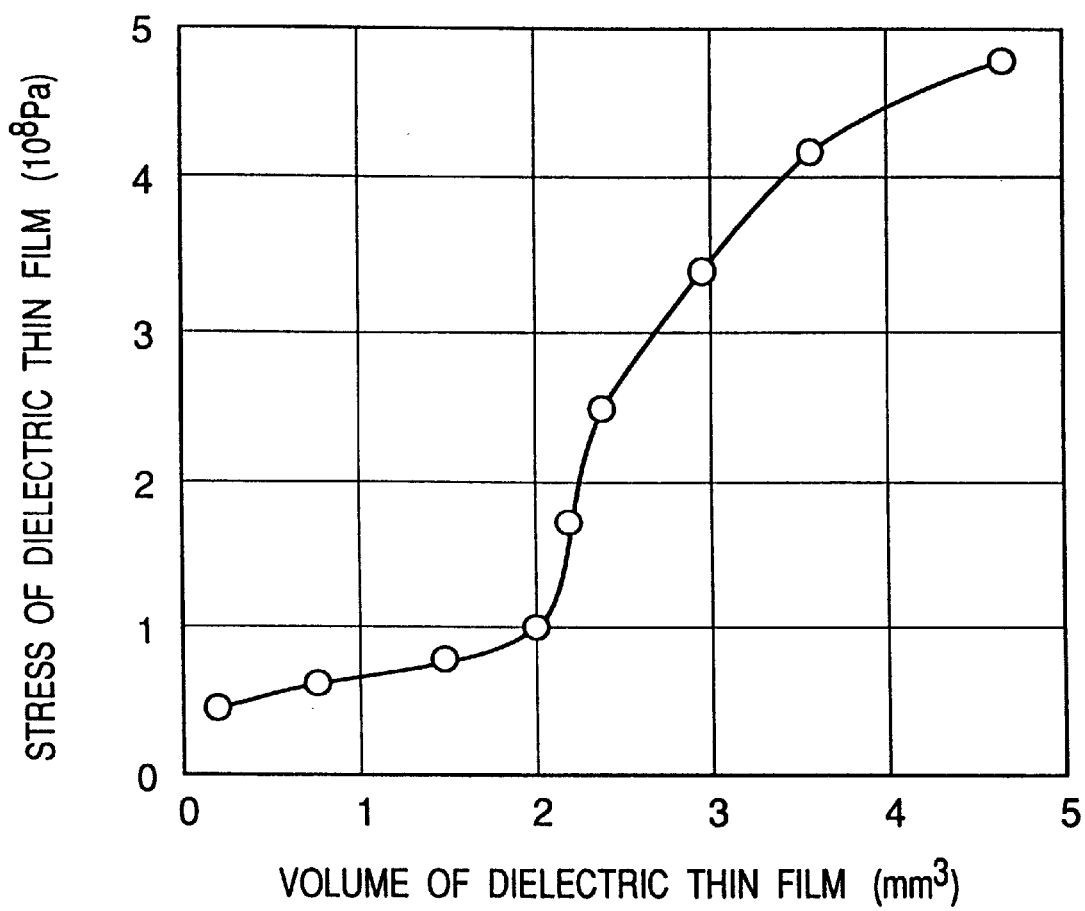
FIG. 3 shows a relationship between volumes and stresses of the dielectric thin film.

A mask 10 made from stainless plate and having a shape as shown in FIG. 2 was placed on the lower layer 2, so that dielectric thin films 3 each having a thickness of 1 μm was formed on each of dielectric thin film forming regions 11 each having a size of 20 mm×20 mm by a RF magnetron sputtering method. In this sputtering, used were a target of lead titanate and a mixed gas of argon and oxygen in the ratio of 9:1. A temperature of the substrate was kept at 600° C. A deposition rate was 50 nm per minute. The resultant substrate was measured and, as a result, it had a deformation of 8.5 μm. FIG. 3 shows a relationship between volumes and stresses of the dielectric thin film when the substrate is made of gallium arsenide and the dielectric thin film is formed by using a target of lead titanate.

Comparative Example 1

A dielectric thin film device was produced by a method similar to that of a first example, except that, for the coating of the lower layer 2 using silicon nitride by the plasma CVD method, a flow rate ratio of a mixed gas of silane of 10% and nitrogen of 90% and ammonia was 80:7. No tensile or compressive stress was generated in the substrate, as a result of which the deflection thereof was zero. When this substrate was used for producing the dielectric thin film 3, the substrate was concavely curved in a direction towards the dielectric film 3 with a deflection of 30 μm and a stress of $3 \times 10^8$ Pa in the substrate.

Comparative Example 2

A dielectric thin film device was produced by a method similar to that of the first example, except that, for the coating of the lower layer 2 using silicon nitride by the plasma CVD method, a flow rate ratio of a mixed gas of silane of 10% and nitrogen of 90% and ammonia was 40:3. A compressive stress was generated in the substrate, as a result of which the substrate was curved in a direction towards the dielectric film 3 with a deflection of 50 μm and a stress of $5 \times 10^8$ Pa in the substrate.

EXAMPLE 3

Figure 4:
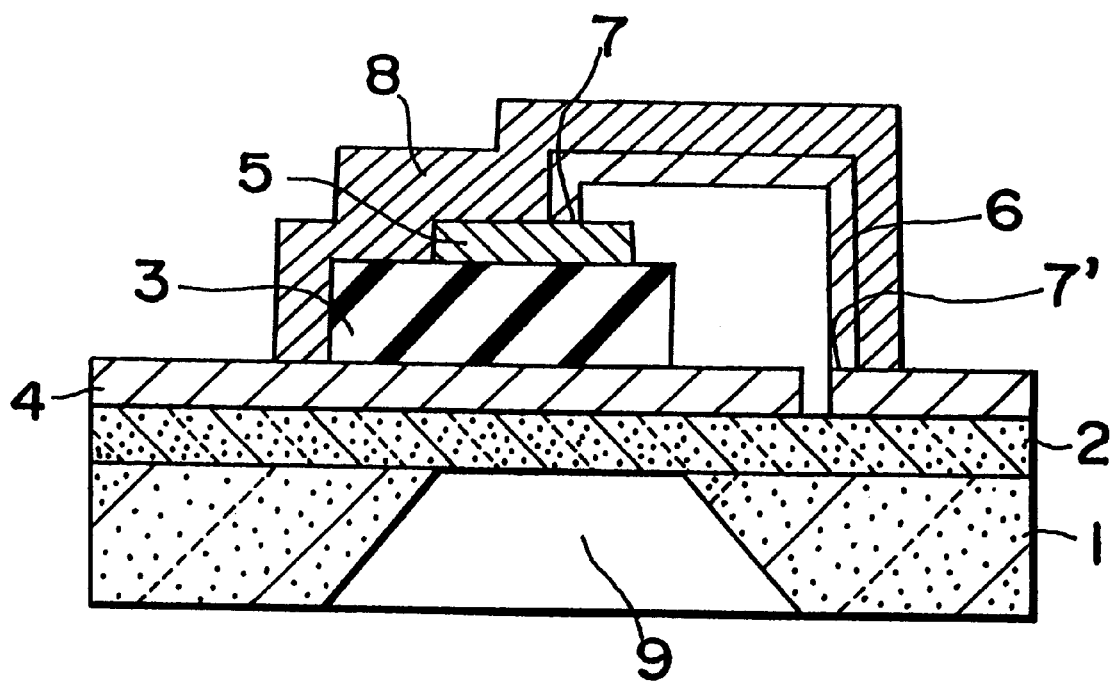
FIG. 4 is a sectional view of a dielectric thin film device of a third example.

FIG. 4 illustrates a sectional view of a third example of the dielectric thin film device according to the present invention, and FIGS. 5A–5H show a process flow of the device. In this example, provided was a substrate 1 in the form of circular plate having a diameter of 3 inches and made of gallium arsenide. A lower layer 2 having a thickness of 100 nanometers and made of nitride silicone was coated on an upper surface of the substrate 1 by a plasma CVD method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 10 nm per minute.

Figure 5:
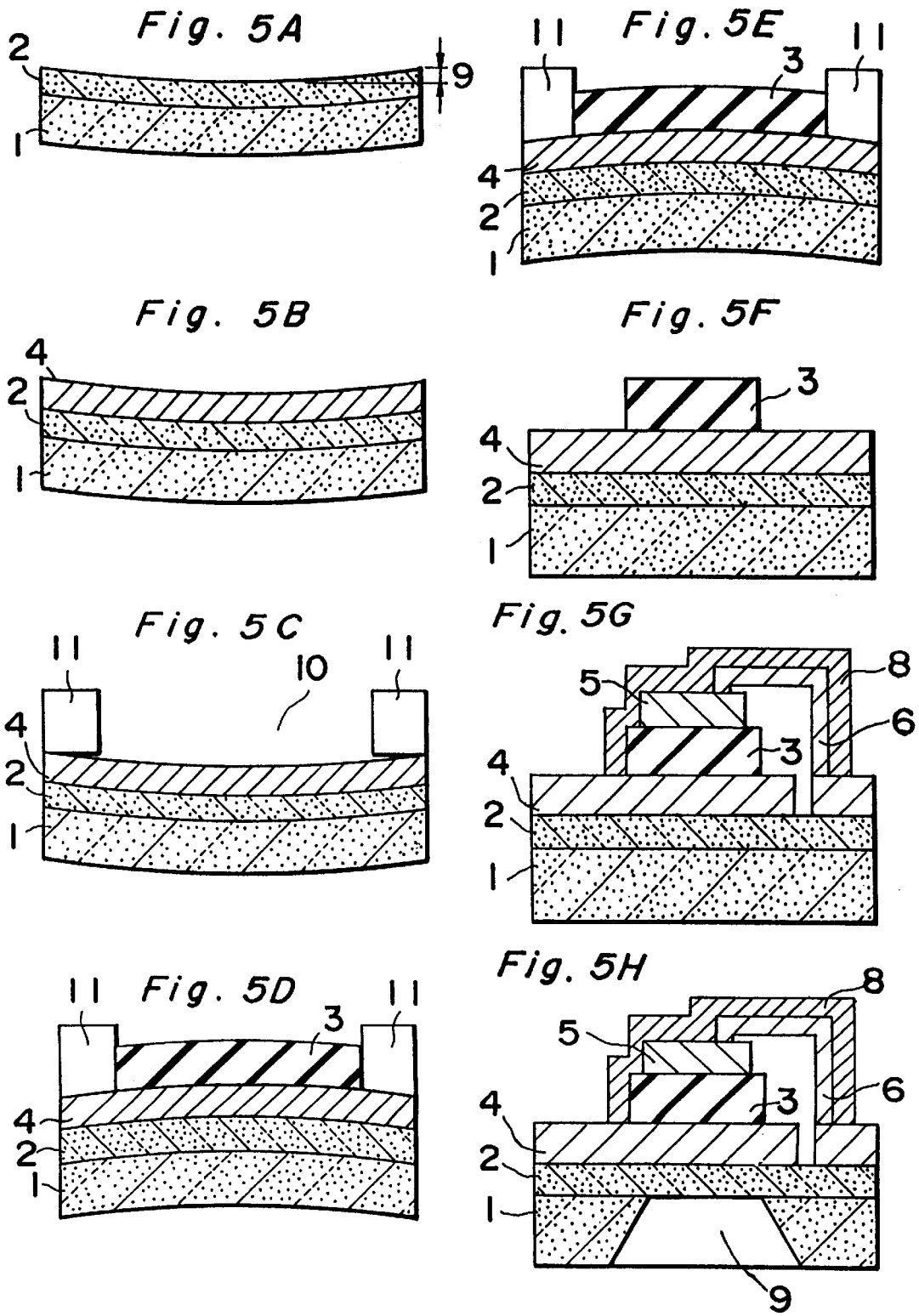
FIGS. 5A–5H are a process flow of the third example.

The lower layer 2 had a tensile stress of $2\times10^8$ Pa, and the substrate 1 was concavely downwardly curved in FIG. 5A with a deflection of 20 μm. As shown in FIG. 5B, a lower electrode 4 made of a titanium film and a platinum film was formed on the lower layer 2. A combined thickness of the titanium film and the platinum film of the lower electrode 4 was 100 nm. The titanium film was coated by a RF magnetron sputtering method, at room temperature, in an argon gas, and at a deposition rate of 15 nm per minute. The platinum film was coated by a RF magnetron sputtering method, at room temperature, in an argon gas, and at a deposition rate of 20 nm per minute.

A mask 10 made from stainless plate as shown in FIG. 2 was placed on the lower electrode 4, so that dielectric thin films 3 each made of lead titanate added by lanthanum oxide and having a thickness of 1 μm were formed in each of dielectric thin film forming regions 11 by a RF magnetron sputtering method. In this sputtering, were used a target of lead titanate added by 8 weight percent of lanthanum oxide and a mixed gas of argon and oxygen in the ratio of 9:1. A temperature of the substrate was kept at 600 °C. A deposition rate was 10 nm per minute.

Afterwards, as shown in FIG. 5F, a photo-resist was coated on each of the dielectric thin films 3, which was then etched by a wet-etching process. A mixed solution of hydrochloric acid, nitric acid, hydrofluoric acid, and water was used for the etchant. Nitric acid was added as oxidizing agent. Hydrofluoric acid was added as assistance of etching. The mixture ratio of hydrochloric acid, nitric acid, hydrofluoric acid, and water of the etchant was 5:3:1:91. This etchant allowed each of the dielectric thin films 3 to be formed into a size of 250 μm×150 μm, without any crack due to selective etching of the grain boundary of the dielectric thin film. The resultant substrate had a deflection of 8 μm.

FIG. 3 shows a relationship between volumes of the dielectric thin film and stresses of the dielectric thin film device, measured after the division of the dielectric thin film. As shown in FIG. 3, the stress tends to increase as the volume of the dielectric thin film increases, and the stress is $1\times10^8$ Pa or more when the dielectric thin film has a volume of 2 mm$^3$ or more. This means that the dielectric thin film that is designed to have a volume of 2 mm$^3$ or less has a stress of $1\times10^8$ Pa or less. Also, it turns out from the equation(1) that the deflection of the substrate is 10 μm or less when the stress is $1\times10^8$ Pa or less.

Accordingly, an accurate upper structure can be formed without being damaged for example by an automated transporting device.

Then, as shown in FIG. 5G, a photoresist was coated on each of the dielectric thin films 3 to form a titanium film 6 having a thickness of 30 nm and a platinum film 7 having a thickness of 70 nm by a vacuum evaporation method, at room temperature and at a deposition rate of 10 nm per minute. An upper electrode 5 was formed into a size of 100 μm×20 μm by using a lift-off method in which a photo-resist was removed by means of acetone, as a result of which an upper structure on each of the dielectric thin films 3 was produced.

The upper electrode 5 was made of two layers i.e. a titanium film and a platinum film and had an overall thickness of 100 nm. The upper electrode 5 was formed by a vacuum evaporation method, at room temperature and at deposition rate of 10 nm per minute. A photo-resist was formed in a location where a bridge was provided and then gold-plated to form a bridge 6 having a thickness of 2 μm and bridge bases 7 and 7'. A protection layer 8 made of silicon nitride was formed on each of the dielectric thin film devices formed on the substrate 1, under the same condition as that used for producing the above-mentioned silicon nitride. By removing partially the substrate 1 from the back surface thereof using a dry-etching method, a cavity 9 was formed to produce a ultrasonic device as dielectric thin film device. Since the deflection of the substrate 1 was 2 μm, the stress in the substrate was $0.4\times10^8$ Pa.

Also, the stress in the dielectric thin film of each of the dielectric thin film devices was estimated from a peak shift of the Raman microspectroscopy, which was 0.1×10Pa. The working portion of the dielectric thin film device, in which the upper electrode 5 was formed, had a deflection of 1 μm.

Figure 7:
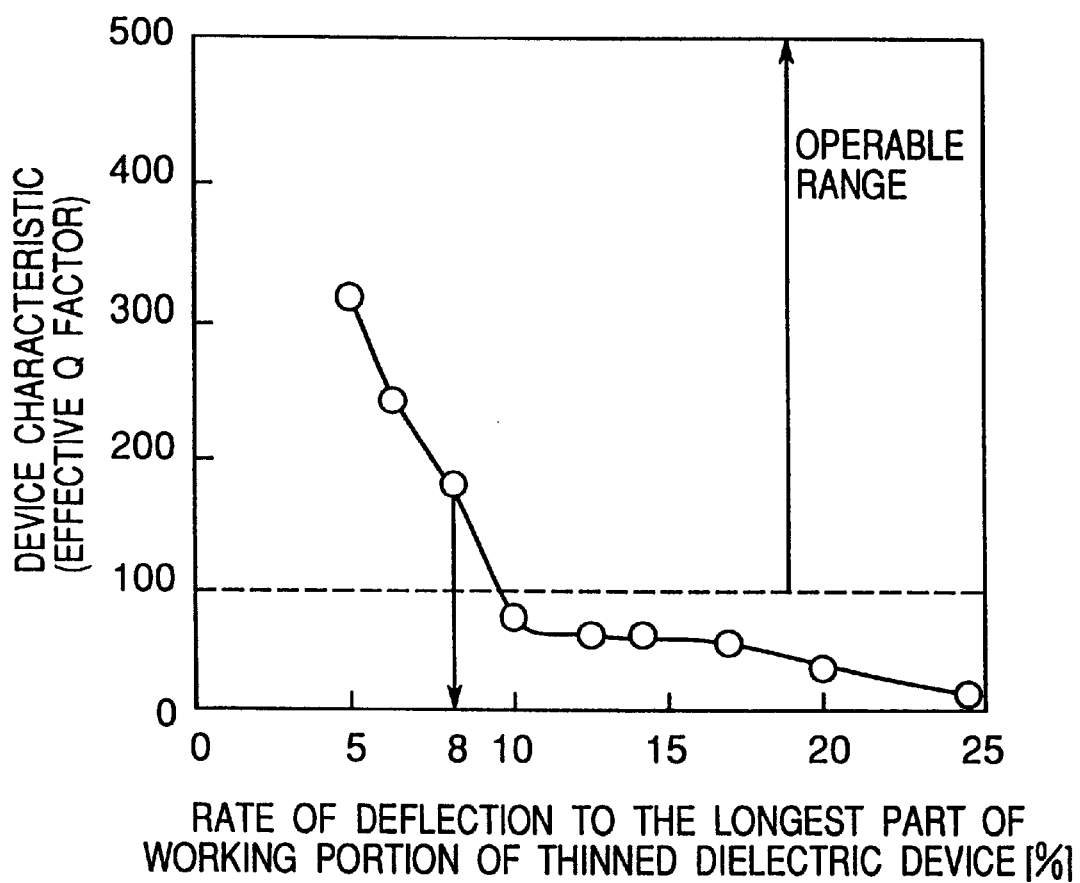
FIG. 7 shows a relationship between deflections of the working portion of the dielectric thin film device and device characteristics; and, FIG. 8 is a sectional view of a dielectric thin film device of a third comparative example.

FIG. 7 shows a relationship between deflections of the working portion of the dielectric thin film device with regard to the longest part and device characteristics. As shown in FIG. 7, the characteristic of the device tends to degrade as the deflection of the working portion with regard to the longest part increases. Also, it was verified that, when the deflection of the working portion with regard to the longest part was 8% or less, the device characteristic was within an operable range for practical use. Although an effective Q factor was used here as a characteristic of the dielectric thin film device, other suitable characteristic parameters may be used instead.

Quantities of hydrofluoric acid and lanthanum oxide, included in the etchant for the dielectric thin film 3, and qualities of etching of the dielectric thin film 3 are shown in Table 1. Table 1 shows that it is effective for the quality of etching to add hydrofluoric acid in the range of 0.5 to 1.0 volume percent.

Table 2 illustrates a relationship between added quantities of lanthanum oxide and stresses of the dielectric thin film 3, showing that lanthanum oxide added in the range of 0.01 to 8 weight percent reduces the stress.

EXAMPLE 4

In this example, provided was a substrate 1 in the form of circular plate having a diameter of 3 inches and made of gallium arsenide. A lower layer 2 having a thickness of 100 nm and made of tantalum oxide was coated on an upper surface of the substrate 1 by a RF magnetron sputtering method. In this sputtering, used were a target of tantalum oxide and mixed gas of argon and oxygen in the ratio of 9:1, at room temperature, and at a deposition rate of 13 nm per minute. A titanium film 4 having a thickness of 30 nm was formed on the lower layer 2. The lower layer 2 had a tensile stress of $2\times10^8$ Pa.

Then, as shown in FIG. 5B, a lower electrode 4 made of a titanium film and a platinum film was formed on the lower layer 2. A combined thickness of the titanium film and the platinum film of the lower electrode 4 was 100 nm. The titanium film was coated by a RF magnetron sputtering method, at room temperature, in an argon gas, and at a deposition rate of 15 nm per minute. The platinum film was coated by a RF magnetron sputtering method, at room temperature, in an argon gas, and at a deposition rate of 20 nm per minute.

A mask 10 made from stainless plate as shown in FIG. 2 was placed on the lower electrode 4, so that dielectric thin films 3 each made of lead titanate added by lanthanum oxide and having a thickness of 1 μm were formed in each of dielectric thin film forming regions 11 by a RF magnetron sputtering method. In this sputtering, were used a target of lead titanate added by 8 weight percent of lanthanum oxide and a mixed gas of argon and oxygen in the ration of 9:1. A temperature of the substrate was kept at 600° C. A deposition rate was 10 nm per minute.

Afterwards, as shown in FIG. 5F, a photo-resist was coated on each of the dielectric thin films 3, which was etched by a wet-etching method. A mixed solution of hydrochloric acid, nitric acid, hydrofluoric acid, and water was used for the etchant. Nitric acid was added as oxidizing agent. Hydrofluoric acid was added as assistance of etching. The mixture ratio of hydrochloric acid, nitric acid, hydrofluoric acid, and water of the etchant was 5:3:1:91. This etchant allowed each of the dielectric thin films 3 to be formed into a size of 250 μm×150 μm, without any crack due to selective etching of the grain boundary of the dielectric thin film. The substrate 1 had a deflection of 8 μm.

Then, as shown in FIG. 5G, a photo-resist was coated on each of the dielectric thin films 3 to form a titanium film 6 having a thickness of 30 nm and a platinum film 7 having a thickness of 70 nm by a vacuum evaporation method, at room temperature and at a deposition rate of 10 nm per minute. An upper electrode 5 was formed into a size of 100 μm×20 μm by using a lift-off method in which a photo-resist was removed by means of acetone, as a result of which an upper structure on each of the dielectric thin films was produced. In this example, a bridge structure described in the third example was not formed.

Figure 6:
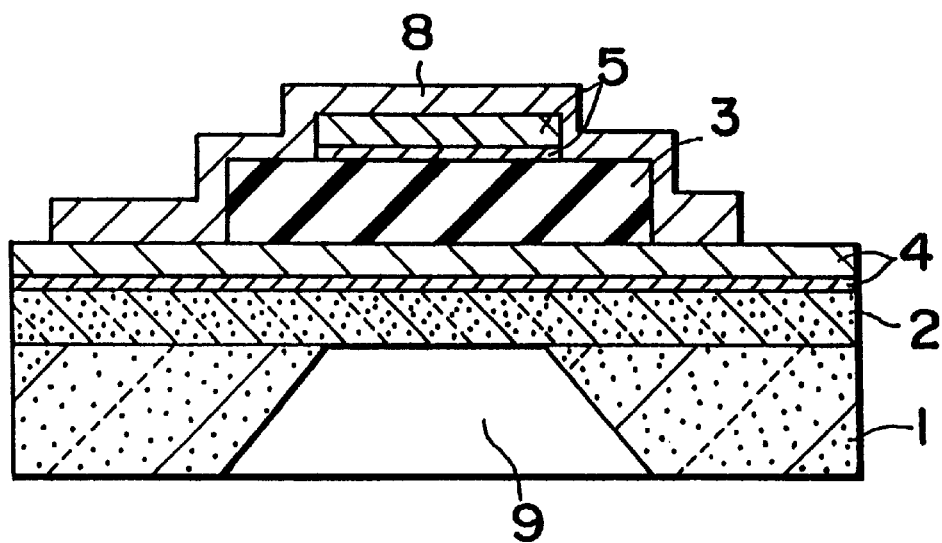
FIG. 6 is a sectional view of a dielectric thin film device of a fourth example.

Then, a protection layer 8 made of tantalum oxide and having a thickness of 100 nm was formed on the surface of the substrate 1. By removing partially the substrate 1 from the back surface thereof using a hybrid method, a cavity 9 having a diameter of 200 μm was formed to define a dielectric thin film device as shown in FIG. 6. Since the dielectric thin film device was coated with the protection layer 8, it was prevented from being resolved due to an etchant used for forming the cavity.

It was verified that the protection layer 8 had a protecting function for protecting the thin film device. The stress of the dielectric thin film device above the cavity was $0.1 \times 10^8$ Pa, calculated from a peak shift of the Raman microspectroscopy. The deflection of the working portion of the device was 1 μm.

EXAMPLE 5

In this example, provided was a substrate 1 in the form of circular plate having a diameter of 3 inches and made of gallium arsenide. A lower layer 2 having a thickness of 100 nm and made of nitride silicone was coated on an upper surface of the substrate 1 by a plasma CVD method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 10 nm per minute. The lower layer 2 had a tensile stress of $2 \times 10^8$ and was curved downwardly as shown in FIG. 5A with a deflection of 20 μm.

Then, as shown in FIG. 5B, a lower electrode 4 made of a titanium film and a platinum film was formed on the lower layer 2. A combined thickness of the titanium film and the platinum film of the lower electrode 4 was 100 nm. The titanium film was coated by a RF magnetron sputtering method, at room temperature, in an argon gas, and at a deposition rate of 15 nm per minute. The platinum film was coated by a RF magnetron sputtering method, at room temperature, in an argon gas, and at a deposition rate of 20 nm per minute.

Afterwards, a mask 11 made of stainless plate was placed on the platinum film 5, so that a dielectric thin film 3 was formed, which was made of calcium lead titanate added by calcium titanate and had a thickness of 1 μm by a RF magnetron sputtering method. In this sputtering, were used a target of lead titanate added by 40 weight percent of calcium titanate and mixed gas of argon and oxygen in the ratio of 9:1. A temperature of the substrate was kept at 600 °C. A deposition rate was 10 nm per minute.

Then, a photo-resist was coated on the dielectric thin film 3, which was then etched by a wet-etching method. A mixed solution of hydrochloric acid, nitric acid, hydrofluoric acid, and water was used for the etchant. Nitric acid was added as oxidizing agent. Hydrofluoric acid was added as assistance of etching. The mixture ratio of hydrochloric acid, nitric acid, hydrofluoric acid, and water of the etchant was 5:3:1:91. This etchant allowed the dielectric thin film 3 to be formed into a size of 250 μm×150 μm, without any crack due to selective etching of the grain boundary of the dielectric thin film. The deflection of the substrate 1 was 8 μm.

Then, as shown in FIG. 5G, a photo-resist was coated on the dielectric thin film 3 to form a titanium film 6 having a thickness of 30 nm and a platinum film 7 having a thickness of 70 nm by a vacuum evaporation method, at room temperature and at a deposition rate of 10 nm per minute. An upper electrode 5 was formed into a size of 100 μm×20 μm by using a lift-off method in which a photo-resist was removed by means of acetone, as a result of which an upper structure on the dielectric thin film was produced.

The stress of the dielectric thin film device was $0.1 \times 10^8$ Pa, calculated from of a peak shift of the Raman microspectroscopy. Table 3 illustrates a relationship between quantities of calcium titanate added and stresses of the dielectric thin film device. Table 3 shows that it is effective for reduction of the stress to add calcium titanate in the range of 0.01 to 42 weight percent.

EXAMPLE 6

In this example, provided was a substrate 1 in the form of circular plate having a diameter of 3 inches and made of gallium arsenide. A lower layer 2 having a thickness of 100 nm and made of nitride silicone was coated on an upper surface of the substrate 1 by a plasma CVD method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 10 nm per minute. The lower layer 2 had a tensile stress of $2 \times 10^8$ Pa and was curved downwardly as in FIG. 5A with a deflection of 20 μm.

Then, as shown in FIG. 5B, a lower electrode 4 made of a titanium film and a platinum film was formed on the lower layer 2. A combined thickness of the titanium film and the platinum film of the lower electrode 4 was 100 nm. The titanium film was coated by a RF magnetron sputtering method, at room temperature, in an argon gas, and at a deposition rate of 15 nm per minute. The platinum film was coated by a RF magnetron sputtering method, at room temperature, in an argon gas, and at a deposition rate of 20 nm per minute.

Afterwards, a mask 11 made of stainless plate was placed on the platinum film 5, so that a dielectric thin film 3 was formed, which was made of strontium lead titanate added by strontium titanate and had a thickness of 1 μm by a RF magnetron sputtering method. In this sputtering, were used a target of lead titanate added by 39 weight percent of strontium titanate and mixed gas of argon and oxygen in the ratio of 9:1. A temperature of the substrate was kept at 600 °C. A deposition rate was 10 nm per minute.

Then, a photo-resist was coated on the dielectric thin film 3, which was then etched by a wet-etching method. A mixed solution of hydrochloric acid, nitric acid, hydrofluoric acid, and water was used for the etchant. Nitric acid was added as oxidizing agent. Hydrofluoric acid was added as assistance of etching. The mixture ratio of hydrochloric acid, nitric acid, hydrofluoric acid, and water of the etchant was 5:3:1:91. This etchant allowed the dielectric thin film 3 to be formed into a size of 250 μm×150 μm, without any crack due to selective etching of the grain boundary of the dielectric thin film. The deflection of the substrate 1 was 8 μm.

Then, as shown in FIG. 5G, a photo-resist was coated on the dielectric thin film 3 to form a titanium film 6 having a thickness of 30 nm and a platinum film 7 having a thickness of 70 nm by a vacuum evaporation method, at room temperature and at a deposition rate of 10 nm per minute. A upper electrode 5 was formed into a size of 100 μm×20 μm by using a lift-off method in which a photo-resist was removed by means of acetone, as a result of which an upper structure on the dielectric thin film was produced.

The stress of the dielectric thin film device was $0.1 \times 10^8$ Pa, calculated from a peak shift of the Raman microspectroscopy. Table 4 illustrates a relationship between quantities of strontium titanate added and stresses of the dielectric thin film device. Table 4 shows that it is effective for reduction of the stress to add strontium titanate in the range of 0.01 to 39 weight percent.

EXAMPLE 7

In this example, provided was a substrate 1 in the form of circular plate having a diameter of 3 inches and made of gallium arsenide. A lower layer 2 having a thickness of 100 nm and made of nitride silicone was coated on an upper surface of the substrate 1 by a plasma CVD method. In this deposition, used was a combination of ammonia and mixed-gas of silane of 10% and nitride of 90%, in which a flow rate ratio of mixed gas and ammonia was 10:1. A temperature of the substrate was kept at 300 °C. A deposition rate was 10 nm per minute. The lower layer 2 had a tensile stress of $2 \times 10^8$ Pa and was curved downwardly as in FIG. 5A with a deflection of 20 μm.

Then, as shown in FIG. 5B, a lower electrode 4 made of a titanium film and a platinum film was formed on the lower layer 2. A combined thickness of the titanium film and the platinum film of the lower electrode 4 was 100 nm. The titanium film was coated by a RF magnetron sputtering method, at room temperature, in an argon gas, and at a deposition rate of 15 nm per minute. The platinum film was coated by a RF magnetron sputtering method, at room temperature, in an argon gas, and at a deposition rate of 20 nm per minute.

Then, a mask 10 made from stainless plate as shown in FIG. 2 was placed on the lower electrode 10, so that dielectric thin films 3 each made of lead titanate added by lanthanum oxide and having a thickness of 1 μm were formed in each of dielectric thin film forming regions 11 by a RF magnetron sputtering method. In this sputtering, were used a target of lead titanate added by 8 weight percent of lanthanum oxide and a mixed gas of argon and oxygen in the ratio of 9:1. A temperature of the substrate was kept at 600 °C. A deposition rate was 10 nm per minute.

Afterwards, as shown in FIG. 5F, a photo-resist was coated on each of the dielectric thin films 3, which was then etched by a wet-etching method. A mixed solution of hydrochloric acid, nitric acid, hydrofluoric acid, and water was used for the etchant. Nitric acid was added as oxidizing agent. Hydrofluoric acid was added as assistance of etching. The mixture ratio of hydrochloric acid, nitricacid, hydrofluoric acid, and water of the etchant was 5:3:1:91. This etchant allowed each of the dielectric thin films 3 to be formed into a size of 250 μm×150 μm, without any crack due to selective etching of the grain boundary of the dielectric thin film. The deflection of the substrate 1 was 8 μm.

Then, as shown in FIG. 5G, a photo-resist was coated on each of the dielectric thin films 3 to form a titanium film 6 having a thickness of 30 μm and a platinum film 7 having a thickness of 70 nm by a vacuum evaporation method, at room temperature and at a deposition rate 10 nm per minute. An upper electrode 5 was formed into a size of 100 μm×20 μm by using a lift-off method in which a photo-resist was removed by means of acetone, as a result of which an upper structure on each of the dielectric thin films was produced. By removing partially the substrate 1 from the back surface thereof using a wet-etching method, a cavity 9 having a diameter of 50 μm was formed. The stress generated in the dielectric thin film device was $0.3 \times 10^{-8}$ Pa, calculated from a peak shift of the Raman microspectroscopy. Also, the deflection of the working portion was 0.5 μm.

Comparative Example 3

Figure 8:
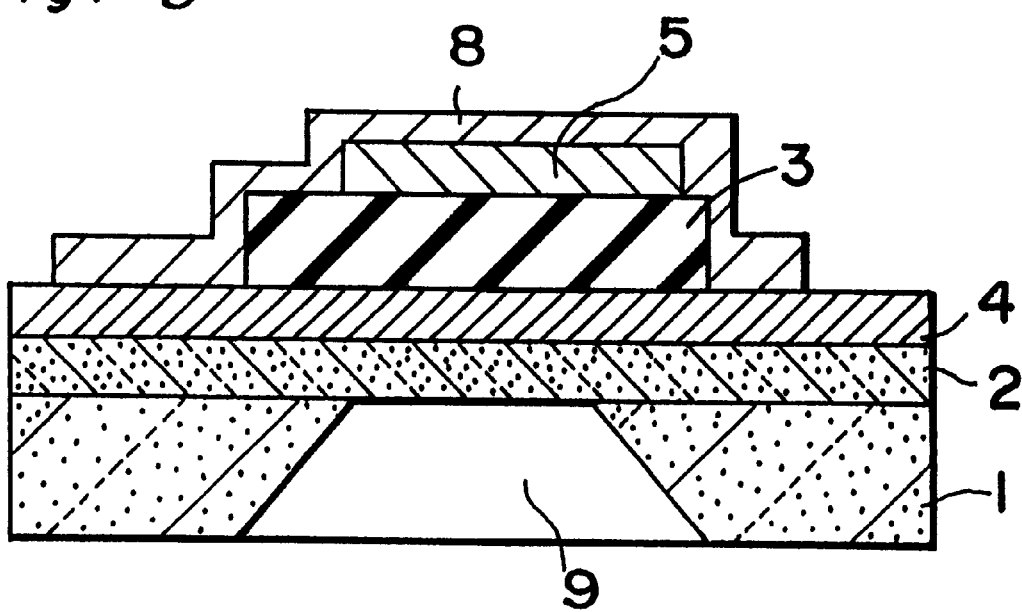

FIG. 8 is a sectional view of a third comparative example of the dielectric thin film device. In the same manner as the seventh example, on a silicon substrate 1 were formed a lower layer 2, a lower electrode 4, a dielectric thin film 3, an upper electrode 5, followed by a formation of a protection layer 8 and a cavity 9 to produce a dielectric thin film device. A bridge was not provided here. In this case, the deflection of the substrate was 4 μm.

Contrary to this, the working portion of the dielectric thin film device where the upper electrode 5 was placed, was curved downwardly in the FIG. 8 with a deflection of 8 μm.

Table 5 illustrates a relationship between materials of the bridge and deflections of the working portion of the dielectric thin film device. Table 5 shows that the presence of the bridge reduces the deflection of the working portion of the device.

INDUSTRIAL APPLICABILITY

According to the present invention, a dielectric thin film device having a stress of $1 \times 10^8$ Pa or less can be produced, by using a lower layer that has a stress in a direction opposite to that of the dielectric thin film, dividing the dielectric thin film into predetermined shapes, placing a stress-adjusting layer on the upper area, adding additives such as lanthanum oxide to the dielectric thin film, and etching it by a strong acid solution added by hydrofluoric acid.

Accordingly, the stress of the dielectric thin film is reduced without degrading the characteristics thereof, which allows the substrate not to be deflected and the upper structure to be formed with accuracy.

What is claimed is:

1. A dielectric thin film device comprising:
   a substrate having a top surface and a bottom surface;
   a lower layer formed on said top surface of said substrate and having an internal stress;
   a lower electrode formed on said lower layer;
   a dielectric thin film formed directly on said lower electrode and having an internal stress;

an upper electrode formed directly on said dielectric thin film;

wherein a portion of said substrate under said dielectric thin film is removed to form a cavity, and wherein a total stress of said lower layer and said dielectric thin film is $1\times10^8$ Pa or less.

2. A dielectric thin film device according to claim 1, wherein said lower layer has a stress in a direction opposite to that of said dielectric thin film.

3. A dielectric thin film device according to claim 1 further including a stress-adjusting layer, which has a stress in a direction opposite to that of said dielectric thin film, said stress adjusting layer serving to protect said device.

4. A dielectric thin film device according to claim 1, wherein said dielectric thin film is made mainly of lead titanate, and said lower layer is a silicon nitride film or a tantalum oxide film.

5. A dielectric thin film device according to claim 1, wherein said dielectric thin film is selected from one of a dielectric thin film that contains 0.01–8 weight percent of lanthanum oxide ($La_2O_3$) and is composed mainly of lead titanate, a dielectric thin film that contains 0.01–42 weight percent of calcium titanate ($CaTiO_3$) and is composed mainly of lead titanate, and a dielectric thin film that contains 0.01–39 weight percent of strontium titanate ($SrTiO_3$) and is composed mainly of lead titanate.

6. A dielectric thin film device according to claim 1, wherein said dielectric thin film is divided into regions each having a volume of 2 $mm^3$ or less.

7. A dielectric thin film device according to claim 1, wherein a bridge is provided between said upper structure and said substrate or said lower layer, so that said bridge reduces the deformation of the working portion of each dielectric thin film device.

8. A dielectric thin film device according to claim 7, wherein said bridge is made of a conductive material that is electrically connected with electrodes of said dielectric thin film device or external electrodes of said dielectric thin film device.

9. A dielectric thin film device comprising:

a substrate having a top surface and a bottom surface;

a lower layer formed on said top surface of said substrate;

a lower electrode formed on said lower layer;

a dielectric thin film formed on said lower electrode and having an internal stress;

an upper electrode formed on said dielectric thin film;

wherein a portion of said substrate under said dielectric thin film is removed to form a cavity, and wherein said lower layer has an internal stress in a direction opposite to the stress within said dielectric thin film.

10. A dielectric thin film device comprising:

a substrate having a top surface and a bottom surface;

a lower layer formed on said top surface of said substrate;

a lower electrode formed on said lower layer;

a dielectric thin film formed on said lower electrode and having an internal stress;

an upper electrode formed on said dielectric thin film;

a protection layer formed on said upper electrode;

wherein a portion of said substrate under said dielectric thin film is removed to form a cavity, and wherein said protection layer has an internal stress in a direction opposite to said stress of said dielectric thin film.

11. A dielectric thin film device comprising:

a substrate having a top surface and a bottom surface;

a lower layer formed on said top surface of said substrate;

a lower electrode formed on said lower layer;

a thin film formed on said lower electrode and having an internal stress;

an upper electrode formed on said dielectric thin film;

wherein a portion of said substrate under said dielectric thin film is removed to form a cavity, and wherein said thin film is selected from one of a dielectric thin film that contains 0.01–8 weight percent of lanthanum oxide ($La_2O_3$) and is composed mainly of lead titanate, a dielectric thin film that contains 0.01–42 weight percent of calcium titanate ($CaTiO_3$) and is composed mainly of lead titanate, and a dielectric thin film that contains 0.01–39 weight percent of strontium titanate ($SrTiO_3$) and is composed mainly of lead titanate.

12. A dielectric thin film device comprising:

a substrate having a top surface and a bottom surface;

a lower layer formed on said top surface of said substrate;

a lower electrode formed on said lower layer;

a dielectric thin film formed on said lower electrode and having an internal stress;

an upper electrode formed on said dielectric thin film;

a third electrode formed on said substrate or on said lower layer;

a bridge electrically connecting said upper electrode and said third electrode;

wherein a portion of said substrate under said dielectric thin film is removed to form a cavity, wherein said bridge is connected at one end thereof to said dielectric thin film via said upper electrode and at the other end thereof on said third electrode, and wherein said bridge reduces the deformation of said dielectric thin film.

13. A dielectric thin film device according to claim 9, wherein said internal stress in said dielectric thin film is a compression stress and said internal stress in said lower layer is a tensile stress.

14. A dielectric thin film device according to claim 9, wherein said lower layer is made of silicon nitride or tantalum oxide.

15. A dielectric thin film device according to claim 10, wherein said internal stress in said dielectric thin film is a compression stress and said internal stress in said protection layer is a tensile stress.

16. A dielectric thin film device according to claim 10, wherein said protection layer is made of silicon nitride or tantalum oxide.

17. A dielectric thin film device according to claim 12, in which said bridge comprises:

a end portion connecting to said upper electrode;

another end portion connecting to said third electrode;

a middle portion connecting said end portion and said another end portion; and wherein said middle portion forms an air gap between itself and said top surface of said substrate or said lower layer or said dielectric thin film or said lower electrode.

18. A dielectric thin film device according to claim 12, wherein said lower layer has an internal stress in a direction opposite to said internal stress in said dielectric thin film.

19. A dielectric thin film device according to claims 9 to 12, wherein said cavity is opened to air at said bottom surface of said substrate.

* * * * *